United States Patent [19]

Comizzoli et al.

[11] 4,296,370

[45] Oct. 20, 1981

[54] METHOD OF DETECTING A THIN INSULATING FILM OVER A CONDUCTOR

[75] Inventors: Robert B. Comizzoli, Belle Mead; Robert D. Vibronek, Sayreville, both of N.J.

[73] Assignee: RCA Corporation, New York, N.Y.

[21] Appl. No.: 83,640

[22] Filed: Oct. 11, 1979

[51] Int. Cl.³ .................... G01R 31/12; G01R 31/26
[52] U.S. Cl. ................................. 324/54; 324/158 R
[58] Field of Search ............ 324/54, 71 R, 158 R, 324/158 T, 71 SN; 427/39

[56] References Cited

U.S. PATENT DOCUMENTS 3,895,127 7/1975 Comizzoli .................. 427/39

FOREIGN PATENT DOCUMENTS 43-28743 12/1968 Japan ...................... 324/54
55-12408 1/1980 Japan ...................... 324/51

OTHER PUBLICATIONS

Comizzoli, Robt. B. "Nondestructive, Reverse Decoration . . . in IC Passivation Overcoats", *Journal of Electrochemical Society*, vol. 124, Jul. 1977, pp. 1087–1095.

Weinberg et al., "Measurement of . . . across a Thin Insulating Film in a Corona Discharge", *Review of Scientific Instruments*, vol. 46, No. 2, Feb. 1975, pp. 201–203.

*Primary Examiner*—Gerard R. Strecker
*Attorney, Agent, or Firm*—Birgit E. Morris; Donald S. Cohen; Joseph D. Lazar

[57] ABSTRACT

A method of detecting the presence of a thin insulating film having a thickness less than about 500 angstroms disposed over a surface of a conductor comprises positioning a conductive grid adjacent the surface of the insulating film. Ions of one type polarity are deposited adjacent the insulating film through openings in the grid, the openings in the grid being sufficiently small to limit the surface charge voltage on the insulating film to less than about 50 volts. After immersing the insulating film in a suspension of charged particles having a polarity opposite to the one type, the deposition of charged particles adjacent the conductor surface then indicates the presence of the insulating film.

8 Claims, 1 Drawing Figure

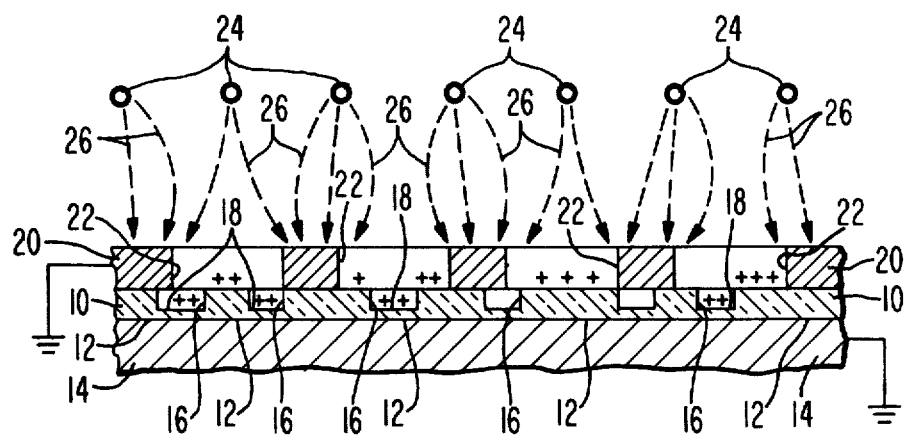

METHOD OF DETECTING A THIN INSULATING FILM OVER A CONDUCTOR

This invention relates to a method of detecting the presence of a thin insulating film having a thickness less than about 500 angstroms disposed over a conductor.

In manufacturing semiconductor devices, there are different steps in the manufacturing process where an insulating layer disposed over a conductor has to be selectively etched in order to define a pattern of openings in the layer. It is often difficult to know exactly when the insulating layer has been etched through to the conductor. For example, a chemical-vapor-deposited (CVD) $SiO_2$ layer or a phosphosilicate glass (PSG) layer is typically used as a passivation overcoat deposited over a metallized integrated circuit (IC) device, normally over the aluminum metallization. Openings must be etched in the insulating layer at bonding pad locations where wires are to be bonded to the aluminum layer. Overetching is undesirable since this will cause undercutting of the insulating layer. If the insulating layer, typically an oxide, is not completely removed from over the bonding pad locations, it is difficult to form a good wire bond to the aluminum layer. A thin oxide or glass layer can be observed in the grid lines over an IC wafer, where it is over silicon, if the layer is about 500 angstroms thick or greater. If it is about 300 angstroms or thinner, then it is not possible to see the oxide layer in a microscope.

A technique for detection of defects in insulating films on semiconductor devices is described in "Nondestructive, Reverse Decoration of Defects in IC Passivation Overcoats", *Journal of Electrochemical Society*, Volume 124, July 1977, pages 1087-1095. The sample is first exposed to an atmospheric pressure, high-voltage discharge (corona) of positive polarity in order to deposit a charge of positive ions into the insulating regions of the sample. Then it is immersed in a suspension of oppositely-charged carbon black insulating liquid. Since the carbon black particles are negatively charged, they are attracted to and deposit on the positively-charged insulating regions of the sample except at defects such as pinholes or cracks over metal. Where there is a hole in the insulator, or no insulator is present, then no carbon is deposited. In this way, a reverse decoration of defects is observed which renders them clearly visible by microscopic observation.

The charging conditions normally used in the above-described process are such that the oxides become charged to about +200 volts. Since a 300 angstrom layer of oxide will support a voltage of only about 30 volts, such a relatively thin oxide breaks down and all the charge leaks away. Consequently, the above technique as normally used will not detect a very thin oxide over a bonding pad or grid line. The present invention comprises a method of detecting the presence of a thin insulating film having a thickness less than about 500 angstroms.

In the drawing:

The sole FIGURE of the drawing is a cross-sectional view of part of an integrated circuit (IC) device illustrating the method of the present invention.

In manufacturing IC devices, an insulating layer 10 disposed over a surface 12 of a conductor 14 is typically selectively etched in order to define a pattern of openings 16 in the insulating layer 10, as shown in the FIGURE. In the present embodiment, the insulating layer 10 comprises a phosphorus-containing silicon dioxide layer deposited over the surface 12 of the conductor 14, which in the present example comprises an aluminum layer. Due to incomplete removal of the insulating layer 10 during the etching process, a thin insulating film 18 may remain adjacent the surface 12 of the conductor 14 in the openings 16, as shown in the FIGURE. Since such incomplete removal of the film 18 from over bonding pad locations will hinder the formation of a good wire bond to the surface 12 of the conductor 14, it is necessary to be able to detect the presence of such a thin film 18, which, if less than 500 angstroms in thickness, is not detectable by microscopic observation.

In accordance with the method of the present invention, a conductive grid 20 is positioned adjacent the surface of the insulating layer 10, as illustrated in the FIGURE. In the present embodiment, the grid 20 comprises an aluminum sheet about 0.8 mm thick with circular openings 22 having a diameter of about 1 mm and a center spacing of about 1.5 mm. The openings in the grid 20 may have any shape, including square openings having a side length of about 1 mm and a center spacing of about 1.5 mm. Preferably, the conductor 14 and the conductive grid 20 are maintained at ground potential.

Ions of one type polarity (positive in the FIGURE) are now deposited adjacent the insulating layer 10, including the thin insulating film 18, through the openings 22 in the grid 20. Depending on the particular type of charging process being used, the openings 22 in the grid 20 should be sufficiently small to limit the surface charge voltage on the thin insulating film 18 to less than about 50 volts. In the present embodiment, the depositing step is performed by utilizing corona discharge wires 24 spaced approximately 2 cm from the insulating layer 10 and connected to a 6,000 volt d-c supply. This charging process using a positive corona potential is typically carried out in a nitrogen ambient with relative humidity (RH) below about 25 percent for a time duration of approximately 18 seconds.

The use of the conductive grid 20 during this charging process prevents overcharging by limiting the surface charge voltage on the thin insulating film 18 to a useful (below breakdown) voltage. This involves the deflection of ions to the grid 20 as the insulating layer 10 is charged, as illustrated by dashed lines 26 in the FIGURE. The ions landing on the insulating layer 10, through the openings 22 in the grid 20, charge up the insulating layer 10. As the ions collect on the insulating layer 10, they generate an electric field in the gas ambient which causes subsequent ions to move transversely from the grid openings 22 to the grid 20, since the grid 20 is at a lower potential. The smaller the grid openings 22, the lower will be the limiting surface voltage.

After the insulating layer 10 is charged, the layer 10 including the thin insulating film 18 is immersed in a suspension of charged particles having a polarity opposite to the one type polarity. Since the one type polarity is positive in the present example, the charged particles should have a negative polarity. The suspension of charged particles may comprise negatively-charged carbon black particles immersed in an insulating liquid. In the present embodiment, after about a 10 second delay after the depositing (charging) step, the insulating layer 10 is dipped into a suspension of 2 ml of carbon concentrate in 400 ml of $C_2Cl_3F_3$ (Freon TF) for approximately 12 seconds. In the present example, the carbon concentrate includes a mixture of Raven 1255 carbon black (Columbian Division, Cities Service Company) dispersed in a toluene dilution of Lubrizol 894 (Lubrizol Corporation) which provides the negative charge to the carbon black. Since the carbon black particles are of sign (negative) opposite to that of the surface charge (positive), the charged particles are deposited on the insulating layer 10 including the thin insulating film 18, thereby visually indicating the presence of the thin film 18 when examined in a microscope at 100–200×. For more detailed information relating to the depositing and immersing steps, see R. B. Comizzoli, "Nondestructive Reverse Decoration of Defects in IC Passivation Overcoats", *Journal of Electrochemical Society,* Volume 124, July 1977, pages 1087–1095, which is identified hereinabove and which is incorporated herein by reference.

The essence of the present novel method resides in the discovery that such a carbon decoration technique can be successfully utilized for detecting the presence of thin insulating films having a thickness less than about 500 angstroms. Our experiments indicate that the presence of a layer of residual insulator as thin as about 100 angstroms may be easily detected by the deposition of carbon on bond pads, grid lines or both. In other words, we have discovered that such a thin layer of insulating material can indeed effectively support a sufficient dielectric charge to cause the deposition of oppositely-charged particles thereon. In one of the experiments, we etched sufficiently long to remove all the residual oxide. The novel process was then applied, and no carbon was deposited on any bond pad or grid line, thereby indicating the validity of the present method in detecting the absence, or presence, of a thin insulating film.

This novel technique is expected to be very useful for monitoring etching processes in semiconductor manufacturing operations. The method is not destructive, and, after removal of the carbon, the semiconductor substrate can continue being processed.

What is claimed is:

1. A method of detecting the presence of a thin insulating film having a thickness less than about 500 angstroms disposed over a surface of a conductor comprising the steps of:

positioning a conductive grid having openings therethrough adjacent the surface of said insulating film, depositing through said openings in said grid ions of one type polarity adjacent said insulating film, said openings in said grid being sufficiently small to limit the surface charge voltage on said insulating film to less than the breakdown voltage of the thin insulating film, and immersing said insulating film in a suspension of charged particles having a polarity opposite to said one type, whereby the deposition of said charged particles adjacent said insulating film indicates the presence of said film.

2. A method as recited in claim 1 wherein said openings in said grid comprise circular openings, having a diameter of about 1 mm and a center spacing of about 1.5 mm.

3. A method as recited in claim 1 wherein said openings in said grid comprise square openings, having a side length of about 1 mm and a center spacing of about 1.5 mm.

4. A method as recited in claim 1 wherein said depositing step is performed by utilizing corona discharge wires spaced approximately two centimeters from said insulating film and connected to a 6,000 volt d-c power supply.

5. A method as recited in claim 1 wherein said conductor and said conductive grid are maintained at ground potential during said depositing step.

6. A method as recited in claim 1 wherein said conductor comprises a layer of aluminum disposed over an integrated circuit device, and wherein said insulating film comprises part of a silicon dioxide layer selectively etched at locations for bonding wires to said aluminum layer.

7. A method as recited in claim 1 wherein said suspension of charged particles comprises charged carbon black particles immersed in an insulating liquid.

8. A method as recited in claim 1, wherein the surface charge voltage on said insulating film is limited to less than about 50 volts.

* * * * *